(12) United States Patent
Parkhurst

(10) Patent No.: US 10,284,157 B2
(45) Date of Patent: May 7, 2019

(54) ANALOG DRIVER WITH BUILT-IN WAVE SHAPING

(71) Applicant: TEXAS INSTRUMENTS INCORPORATED, Dallas, TX (US)

(72) Inventor: Charles Parkhurst, Murphy, TX (US)

(73) Assignee: TEXAS INSTRUMENTS INCORPORATED, Dallas, TX (US)

(*) Notice: Subject to any disclaimer, the term of this patent is extended or adjusted under 35 U.S.C. 154(b) by 201 days.

(21) Appl. No.: 15/392,117

(22) Filed: Dec. 28, 2016

(65) Prior Publication Data
US 2018/0181180 A1 Jun. 28, 2018

(51) Int. Cl.
H03F 3/45 (2006.01)

(52) U.S. Cl.
CPC ..... H03F 3/45179 (2013.01); H03F 3/45183 (2013.01); H03F 3/45273 (2013.01); H03F 2203/45154 (2013.01); H03F 2203/45248 (2013.01)

(58) Field of Classification Search
CPC ..... H04L 25/4902; H03M 5/08; H03M 1/822; H03K 9/10; H03K 7/08; H03K 5/02; H03K 5/023; H03K 5/01; H03K 5/1534; H03K 5/12; H03K 19/01721; H03F 3/2171; H03F 2203/45248; H03F 2203/45154; H03F 2200/555
See application file for complete search history.

(56) References Cited

U.S. PATENT DOCUMENTS

| | | | | |
|---|---|---|---|---|
| 4,908,526 A | * | 3/1990 | Mefford | H03K 5/086 327/170 |
| 4,991,435 A | * | 2/1991 | Colarossi | G01F 23/0084 377/21 |
| 5,218,247 A | * | 6/1993 | Ito | H03K 19/0013 326/27 |
| 5,278,997 A | * | 1/1994 | Martin | H03F 1/0261 330/127 |
| 5,412,343 A | * | 5/1995 | Rijns | H03F 3/45192 330/253 |
| 5,430,408 A | * | 7/1995 | Ovens | H03K 17/04106 327/403 |
| 5,977,829 A | * | 11/1999 | Wells | H03F 1/3217 330/267 |

(Continued)

OTHER PUBLICATIONS

R. Klinke, B. J. Hosticka and H. -. Pfleiderer, "A Very High Slew-Rate Dynamic CMOS Operational Amplifier," ESSCIRC '88: Fourteenth European Solid-State Circuits Conference, Manchester, UK, 1988, pp. 203-206. (Year: 1988).*

Primary Examiner — Jaweed A Abbaszadeh
Assistant Examiner — Brian J Corcoran
(74) Attorney, Agent, or Firm — John R. Pessetto; Charles A. Brill; Frank D. Cimino

(57) ABSTRACT

An amplifier includes a dynamic bias circuit and an amplification circuit coupled to the dynamic bias circuit. The dynamic bias circuit includes a plurality of transistors coupled to a plurality of resistors. The dynamic bias circuit is configured to generate a bias current with a magnitude that increases in response to the dynamic bias circuit receiving a falling edge of an input signal and decreases in response to the dynamic bias circuit receiving a rising edge of the input signal. The amplification circuit is configured to receive the bias current and amplify the input signal based on the bias current to generate an output signal that has a higher slew rate for a falling signal than for a rising signal.

9 Claims, 3 Drawing Sheets

(56) References Cited

U.S. PATENT DOCUMENTS

| | | | | | |
|---|---|---|---|---|---|
| 6,130,563 | A * | 10/2000 | Pilling | ............... | H03K 17/164 327/111 |
| 6,670,836 | B1 * | 12/2003 | Zivanovic | .......... | H03K 19/0016 327/108 |
| 7,019,551 | B1 * | 3/2006 | Biesterfeldt | ......... | H03K 17/163 326/27 |
| 7,078,962 | B2 | 7/2006 | Parkhurst | | |
| 2005/0151573 | A1 * | 7/2005 | Gao | .................. | G06F 1/025 327/263 |
| 2005/0179495 | A1 * | 8/2005 | Sung | ................... | H03F 3/3022 330/255 |
| 2005/0275463 | A1 * | 12/2005 | Heightley | ........... | H03F 3/45183 330/261 |
| 2005/0285676 | A1 * | 12/2005 | Jones | ................... | H03F 3/3022 330/255 |
| 2006/0220741 | A1 * | 10/2006 | Jones | ................. | H03F 3/45192 330/253 |
| 2007/0216475 | A1 * | 9/2007 | Chou | ................... | H03F 3/45183 330/9 |
| 2008/0024217 | A1 * | 1/2008 | Chiu | ................... | H03F 3/45183 330/253 |
| 2010/0308784 | A1 * | 12/2010 | Scoones | ................ | H02M 1/32 323/282 |
| 2011/0215868 | A1 * | 9/2011 | Thakker | ............. | H03F 3/45475 330/252 |
| 2013/0249635 | A1 * | 9/2013 | Kim | ...................... | H03F 3/3028 330/261 |
| 2014/0139941 | A1 * | 5/2014 | Kuehlwein | ...... | G11B 20/10009 360/46 |
| 2014/0207984 | A1 * | 7/2014 | Maung | ................. | G06F 13/385 710/105 |
| 2014/0266449 | A1 * | 9/2014 | Montazer | ............. | H03F 1/0261 330/261 |
| 2014/0361813 | A1 * | 12/2014 | Miao | ...................... | H03K 3/01 327/108 |
| 2015/0107367 | A1 * | 4/2015 | Kosberg | ................ | B81B 7/008 73/754 |

* cited by examiner

ANALOG DRIVER WITH BUILT-IN WAVE SHAPING

BACKGROUND

The single edge nibble transmission (SENT) protocol is a lightweight protocol designed for communication between remote sensor units and control units (e.g., engine control units in automobiles). A SENT encoder accepts nibbles (4 bits) of data at a time, and converts each nibble into a pulse on a data line which has a variable duration dependent on the data. The pulse duration is referenced from falling edge to falling edge on the data line. Thus, the driving circuit is not required to match rise and fall times to determine pulse duration. In fact, data being sent utilizing the SENT protocol includes a waveform shape that has a faster fall time than a rise time. For example, the fall time for SENT transmitted data must not exceed 6.5 μs for a 3 μs nominal clock tick while the rise time for SENT transmitted data must not exceed 18 μs for a 3 μs nominal clock tick.

SUMMARY

In accordance with at least one embodiment of the invention, an amplifier includes a dynamic bias circuit and an amplification circuit coupled to the dynamic bias circuit. The dynamic bias circuit includes a plurality of transistors coupled to a plurality of resistors. The dynamic bias circuit is configured to generate a bias current with a magnitude that increases in response to the dynamic bias circuit receiving a falling edge of an input signal and decreases in response to the dynamic bias circuit receiving a rising edge of the input signal. The amplification circuit is configured to receive the bias current and amplify the input signal based on the bias current to generate an output signal that has a higher slew rate for a falling signal than for a rising signal.

Another illustrative embodiment is a circuit that includes a plurality of resistors and a plurality of transistors coupled to the plurality of resistors. The plurality of transistors is configured to generate a bias current with a magnitude that increases in response to a first transistor of the plurality of transistors receiving a falling edge of an input signal and decreases in response to the first transistor receiving a rising edge of the input signal.

Yet another illustrative embodiment is a method for generating a digital output signal. The method includes receiving, by a dynamic bias circuit, an input signal from a sensor. The method also includes generating, by the dynamic bias circuit, a bias current with a magnitude that increases in response to the dynamic bias circuit receiving a falling edge of the input signal and decreases in response to the dynamic bias circuit receiving a rising edge of the input signal. The method also includes amplifying, by an amplification circuit, the input signal based on the bias current to generate the digital output signal that has a higher slew rate for a falling signal than for a rising signal.

BRIEF DESCRIPTION OF THE DRAWINGS

For a detailed description of various examples, reference will now be made to the accompanying drawings in which.

DETAILED DESCRIPTION

Figure 1:
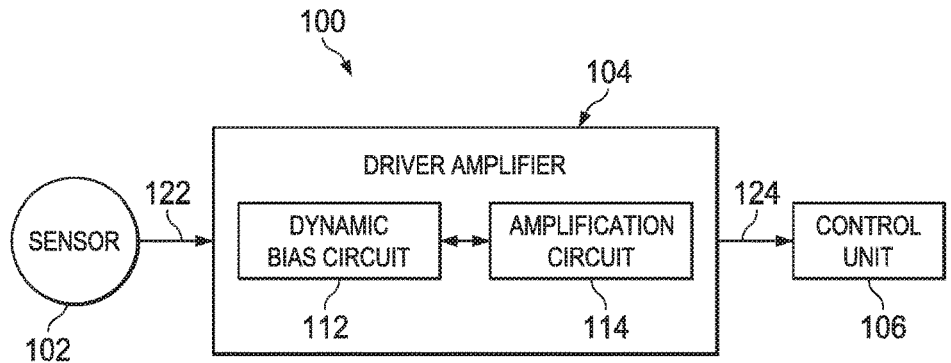
FIG. 1 shows an illustrative block diagram of system for transmitting sensor data to a control unit utilizing a driver amplifier in accordance with various examples.

The following discussion is directed to various embodiments of the disclosure. Although one or more of these embodiments may be preferred, the embodiments disclosed should not be interpreted, or otherwise used, as limiting the scope of the disclosure, including the claims. In addition, one skilled in the art will understand that the following description has broad application, and the discussion of any embodiment is meant only to be exemplary of that embodiment, and not intended to intimate that the scope of the disclosure, including the claims, is limited to that embodiment.

Certain terms are used throughout the following description and claims to refer to particular system components. As one skilled in the art will appreciate, companies may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . ." Also, the term "couple" or "couples" is intended to mean either an indirect or direct connection. Thus, if a first device couples to a second device, that connection may be through a direct connection, or through an indirect connection via other devices and connections. The recitation "based on" is intended to mean "based at least in part on." Therefore, if X is based on Y, X may be based on Y and any number of other factors.

The SENT protocol is designed to send data collected by remote sensor units to control units. For example, the SENT protocol may be utilized to transmit pressure data collected by a pressure sensor in an automobile to the engine control unit in the automobile. The sensor is configured to collect the data which is amplified by a driver and provided to the control unit as a digital signal comprising multiple pulses. A SENT encoder accepts nibbles (4 bits) of data at a time, and converts each nibble into a pulse on a data line which has a variable duration dependent on the data. Because pulse duration is referenced from falling edge to falling edge on the data line, the driver is not required to match rise and fall times to determine pulse duration. In fact, data being sent utilizing the SENT protocol includes a waveform shape that has a faster fall time than a rise time.

In many applications it is desirable to utilize a single amplifier to process both analog signals and digital signals without trading-off analog performance (e.g., required transconductance, output resistance, settling time, DC errors, etc.) or digital performance (e.g., provide output signals that comply with the SENT protocol) in a sensor output driver. However, in order for a conventional amplifier to guarantee phase margin for a wide range of loads, a compensation scheme that makes the amplifier's transient response unsuitable for SENT may be used. Modification of the amplifier to comply with the SENT protocol impacts the analog performance. Therefore, conventional drivers may utilize two outputs for the chip, one an analog output and the second a digital output. However, this makes the chip more expensive and more complicated. As such, there is a need for a single sensor output driver that provides the analog performance required by the sensor while also generating digital output signals that comply with the SENT protocol.

In accordance with various examples, a driver amplifier may be provided that changes the large signal (peak voltage approaches rail-to-rail) response of the amplifier in order to comply with the SENT protocol (i.e., fall time and rise time requirements) without affecting the small signal (peak voltage are approximately less than 500 mV) performance of the amplifier. Such an amplifier may include a dynamic bias circuit that generates a bias current to bias an amplification circuit. The dynamic bias circuit may be configured to generate the bias current such that the bias current increases in magnitude as the driver receives a falling edge in the input signal from the sensor and decreases in magnitude as the driver receives a rising edge in the input signal from the sensor. Thus, when a rising edge of the input signal is received by the amplification circuit, because the bias current is limited, the rise time of the output signal is increased. When a falling edge of the input signal is received by the amplification circuit, because the bias current is boosted, the fall time of the output signal is decreased. When the amplifier is in a steady state, the bias current remains constant. Thus, when the amplifier is operating in a steady state, because the bias current is constant, the amplifier's linear behavior is unaffected. In this way, the driver may generate output signals that comply with the SENT protocol while maintaining analog performance.

FIG. 1 shows an illustrative block diagram of system 100 for transmitting sensor data to a control unit 106 utilizing a driver amplifier 104 in accordance with various examples. The system 100 may include a sensor 102, driver amplifier 104, and control unit 106. The sensor 102 may be any type of sensor, such as a pressure sensor, a position sensor, a throttle position sensor, an airflow sensor, a temperature sensor, a strain sensor, a humidity sensor, etc. For example, the sensor 102 may be a resistive bridge sensor (e.g., a Wheatstone bridge) which measures changes in resistance. This change in resistance may represent a change in a physical parameter such as strain, pressure, temperature, humidity, etc. Thus, the sensor 102 may be configured to generate a signal (input signal 122) that is indicative of the physical parameter being sensed. In some embodiments, the input signal 122 may be in the form of a voltage. Additionally, in some embodiments, the input signal 122 is a digital signal, thus, the analog sensed parameters from the sensor 102 may be converted by an analog-to-digital converter (not shown) to generate the input signal 122 in a digital format. Furthermore, the input signal 122 may be a differential signal (i.e., a differential pair of signals). Thus, input signal 122 may be a pair of the same signal, except that the two signals are 180 degrees out of phase with each other. Thus, the input signal 122 may include a positive input (phase) of the input signal 122 and a negative input (phase) of the input signal 122 that are 180 degrees out of phase with each other as input for the driver amplifier 104. In other words, positive input may mirror the negative input. In some embodiments, the sensor 102 may be located inside an automobile.

The driver amplifier 104 may include a dynamic bias circuit 112 and an amplification circuit 114. The dynamic bias circuit 112 may be configured to receive the input signal 122 and detect when a falling edge of the input signal 122 is received, when a rising edge of the input signal 122 is received, and when the input signal 122 is in a steady state (when the input signal 122 is at a constant voltage). When the dynamic bias circuit 112 detects that the input signal 122 is in a steady state, the dynamic bias circuit 112 may be configured to generate a constant bias current. However, when the dynamic bias circuit 112 detects that a rising edge (i.e., a transition of the digital input signal 122 from low to high) of the input signal has been received, the dynamic bias circuit 112 may generate a bias current with an increased magnitude. Furthermore, when the dynamic bias circuit 112 detects that a falling edge (i.e., a transition of the digital input signal 122 from high to low) of the input signal has been received, the dynamic bias circuit 112 may generate a bias current that decreases in magnitude. In other words, the dynamic bias circuit 112 may be configured to generate a bias current with a magnitude that increases in response to the dynamic bias circuit 112 receiving a falling edge of the input signal 122 and decreases in response to the dynamic bias circuit receiving a rising edge of the input signal 122.

The amplification circuit 114 may be configured to also receive the input signal 122 and the bias current generated by the dynamic bias circuit 112. The amplification circuit 114 may be configured to amplify the input signal 122 based on the bias current to generate an output signal 124. Thus, because the bias current increases in response to a falling edge being detected by the dynamic bias circuit 112 in the input signal 122, the amplification circuit 114 will generate an output signal 124 with a relatively high slew rate (i.e., change in voltage per unit of time). For example, the output signal 124 may have a fall time (i.e., time for the signal to transition from high to low) of 4 µs. Additionally, because the bias current decreases in response to a rising edge being detected by the dynamic bias circuit 112 in the input signal 122, when the amplification circuit 114 receives the same rising edge, the amplification circuit 114 will generate an output signal 124 with a relatively lower slew rate. For example, the output signal 124 may have a rise time (i.e., time for the signal to transition from low to high) of 8 µs. In other words, amplification circuit 114 may be configured to generate an output signal 124 that has a higher slew rate for a falling signal than for a rising signal. Because the fall time is faster than the rise time the output signal 124 complies with the SENT protocol.

In some embodiments, the driver amplifier 104, including the dynamic bias circuit 112 and the amplification circuit 114, may also be configured to receive analog input signals and generate analog output signals. The amplification circuit 114 may be designed to include a compensation scheme such that the amplification circuit 114 may provide good phase margin for a wide range of loads. A conventional amplifier that includes such compensation affects the response in large signals. Thus, when the conventional amplification circuit receives a digital input signal, such as digital input signal 122, the compensation makes it unsuitable for generating SENT output signals. However, due to the bias current generated by dynamic bias circuit 112, the amplification circuit 114 may generate digital output signals 124 that comply with the SENT protocol and amplify analog signals with good phase margin for a wide range of loads.

The control unit 106 may be any type of control unit that receives sensor data and controls one or more devices based on the sensor data. For example, the control unit 106 may be an engine control unit that controls actuators in the internal combustion engine of an automobile to provide optimal engine performance. Thus, the control unit 106 may receive the sensor data from sensor 102 as output signal 124 and adjust the engine actuators based on the sensor data to ensure optimal engine performance in the automobile. In alternative embodiments, the control unit 106 may control other devices in any type of system based on the received sensor data provided in output signal 124.

Figure 2:
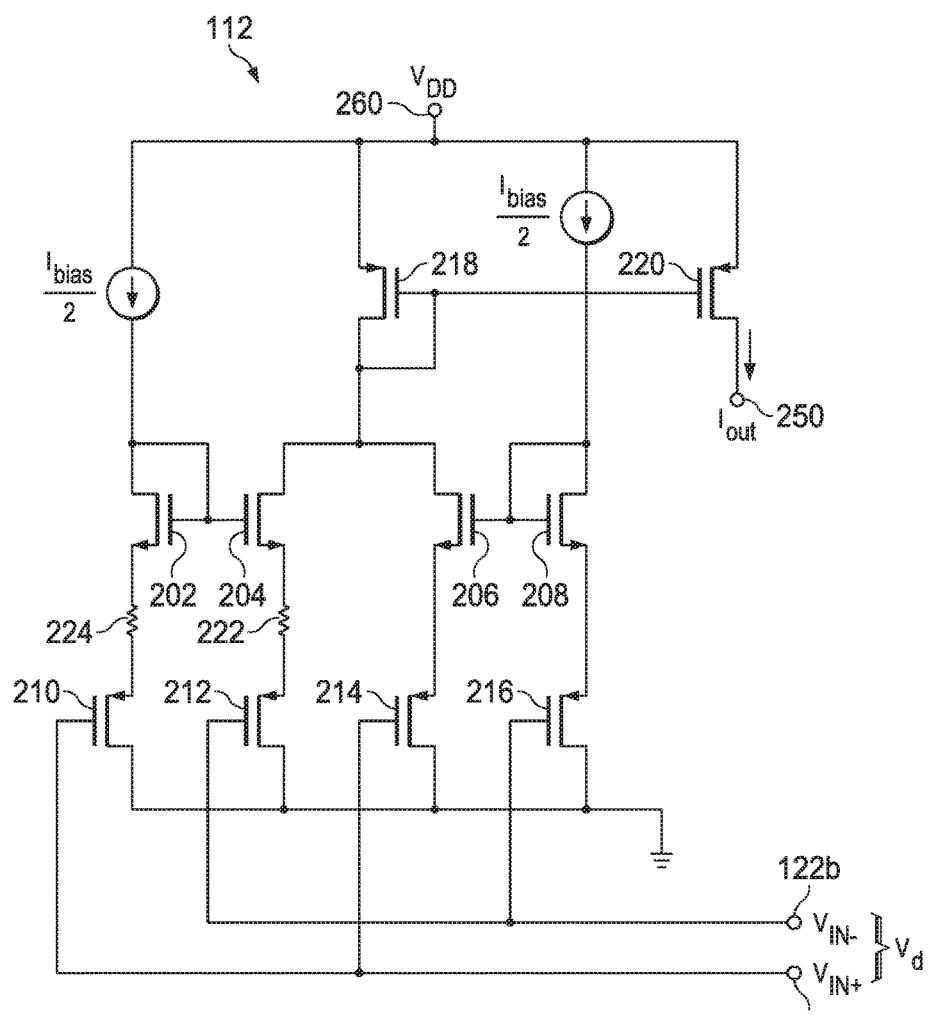
FIG. 2 shows an illustrative circuit diagram of a dynamic bias circuit of a driver amplifier in accordance with various examples.

FIG. 2 shows an illustrative circuit diagram of dynamic bias circuit 112 of driver amplifier 104 in accordance with various examples. The dynamic bias circuit 112 may include a plurality of transistors 202-220 and a plurality of resistors 222-224 connected in a configuration such that the magnitude of output bias current 250, that is received by the amplification circuit 114, increases in response to a falling edge in the input signal 122 and decreases in response to a rising edge in the input signal 122. In some embodiments, the transistors 202-208 are n-channel metal-oxide semiconductor field-effect (NMOS) transistors while the transistors 210-220 are p-channel metal-oxide semiconductor field-effect (PMOS) transistors. In alternative embodiments, transistors 202-220 may be any type of transistor, including a NMOS transistors, PMOS transistors, a p-type junction gate field-effect transistor (PJFET), a n-type junction gate field-effect transistor (NJFET), and a bipolar junction transistor (BJT) (including PNP and NPN transistors).

In some embodiments, the gate of transistor 210 may be connected to the positive input 122a (the positive input of input signal 122). The drain of transistor 210 may be connected to ground. The source of transistor 210 may be connected to resistor 224. The gate of transistor 212 may be connected to the negative input 122b (the negative input of input signal 122). The drain of transistor 212 may be connected to ground. The source of transistor 212 may be connected to resistor 222. The gate of transistor 214 may be connected to the positive input 122a. The drain of transistor 214 may be connected to ground. The source of transistor 214 may be connected to the source of transistor 206. The gate of transistor 216 may be connected to the negative input 122a. The drain of transistor 216 may be connected to ground. The source of transistor 216 may be connected to the source of transistor 208.

Furthermore, in some embodiments, the gate of transistor 202 may be connected to the gate of transistor 204. The drain of transistor 202 may be connected to current source Ibias/2. In some embodiments, the power supply 260 may be the positive power rail of the dynamic bias circuit 112. The source of transistor 202 may be connected to resistor 224. The drain of transistor 204 may be connected to the drain of transistor 206 and the drain of transistor 218. The source of transistor 204 may be connected to the resistor 222. The gate of transistor 206 may be connected to the gate of transistor 208. The drain of transistor 206 may be connected, in addition to the drain of transistor 204, to the drain of transistor 218. The drain of transistor 208 may be connected to current source Ibias/2. The gate of transistor 218 may be connected to the gate of transistor 220. The source of transistor 218 may be connected to the power supply 260. The source of transistor 220 may be connected to the power supply 260. The drain of transistor 220 may be connected to the amplification circuit 114.

In this configuration, the dynamic bias circuit 112 may receive the input signal 122 as the differential signal Vd (the difference between the positive input 122a and the negative input 122b). As a rising edge in the input signal 122 is received by the dynamic bias circuit 112, the bias current 250, which is produced by the transistor 220 at its drain, is limited by resistors 222-224. Thus, the bias current 250 decreases in response to the dynamic bias circuit 112 receiving a rising edge in the input signal 122. As a falling edge in the input signal 122 is received by the dynamic bias circuit 112, the bias current 250 is boosted by transistor 206.

Thus, the bias current 250 increases in response to the dynamic bias circuit 112 receiving a falling edge in the input signal 122.

Figure 3:
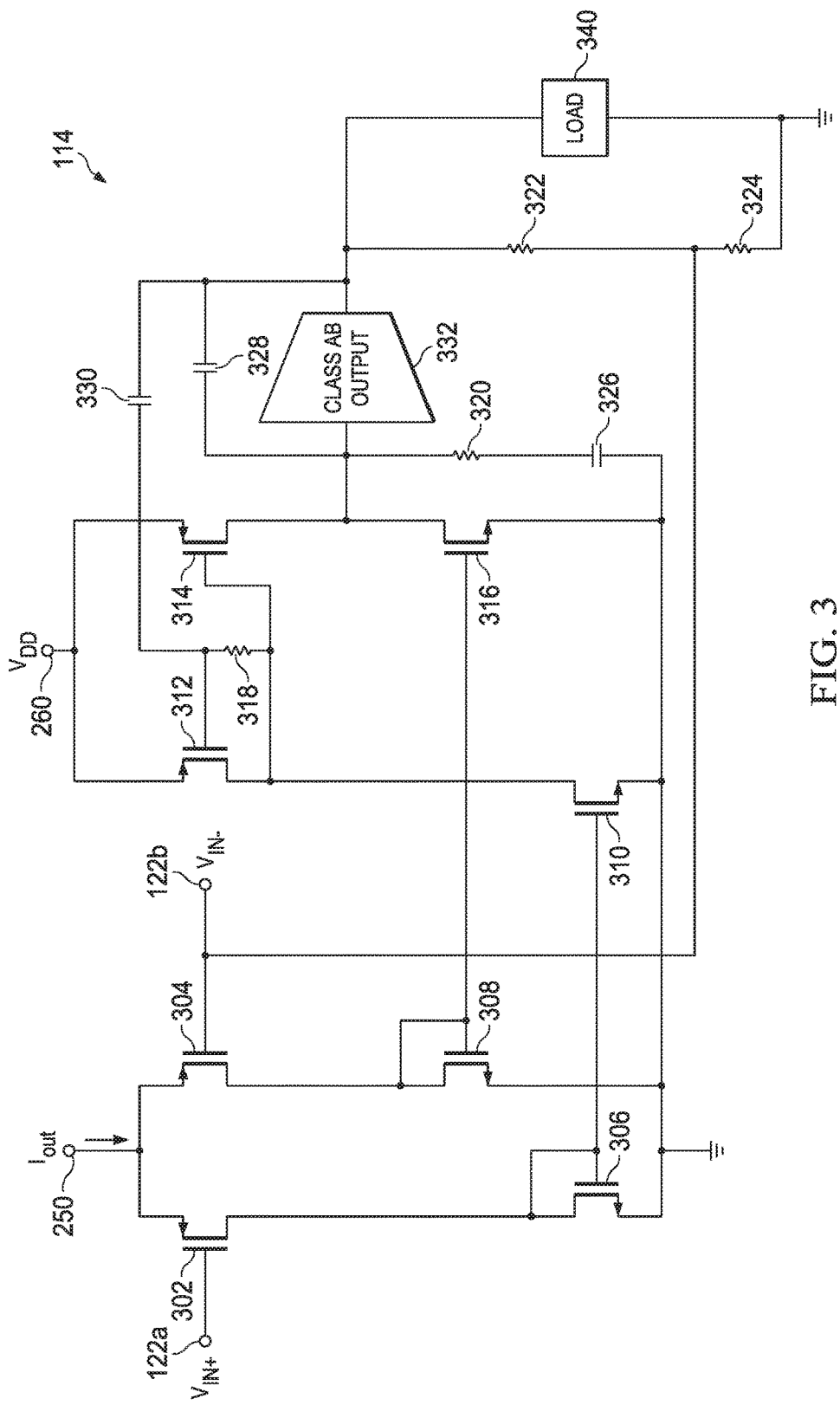
FIG. 3 shows an illustrative circuit diagram of an amplification circuit of a driver amplifier in accordance with various examples.

FIG. 3 shows an illustrative circuit diagram of amplification circuit 114 of driver amplifier 104 in accordance with various examples. The amplification circuit 114 may include a plurality of transistors 302-316, a plurality of resistors 318-324, a plurality of capacitors 326-328, amplifier 332, and a load 340. In some embodiments, the transistors 306-310 and 316 are NMOS transistors while the transistors 302-304 and 312-314 are PMOS transistors. In alternative embodiments, transistors 302-316 may be any type of transistor, including a NMOS transistors, PMOS transistors, PJFET transistors, NJFET transistors, and BJT transistors (including PNP and NPN transistors).

In some embodiments, the source of the transistor 302 may be connected to the drain of transistor 220 from FIG. 2 and, thus, may receive the bias current 250. The gate of the transistor 302 may be connected to the positive input 122a. The source of transistor 304 may also be connected to the drain of transistor 220 from FIG. 2 and, thus, may also receive the bias current 250. The gate of the transistor 304 may be connected to the negative input 122b. The remaining components of the amplification circuit 114 provide compensation and amplification of the input signal 122 so that the amplification circuit 114 provides good phase margin for a wide range of loads.

In this configuration, the amplification circuit 114 may generate an output signal 124 that complies with the SENT protocol. In other words, the bias current 250 acts upon the amplification circuit 114 in a way such that the fall time of the output signal 124 is faster than the rise time of the output signal 124. More specifically, as the bias current 250 decreases (a rising edge is received in the input signal 122), the rise time increases, and, as the bias current 250 increases (a falling edge is received in the input signal 122), the fall time decreases. Thus, the driver amplifier 104 provides a large signal response that complies with the SENT protocol without effecting small signal performance.

Figure 4:
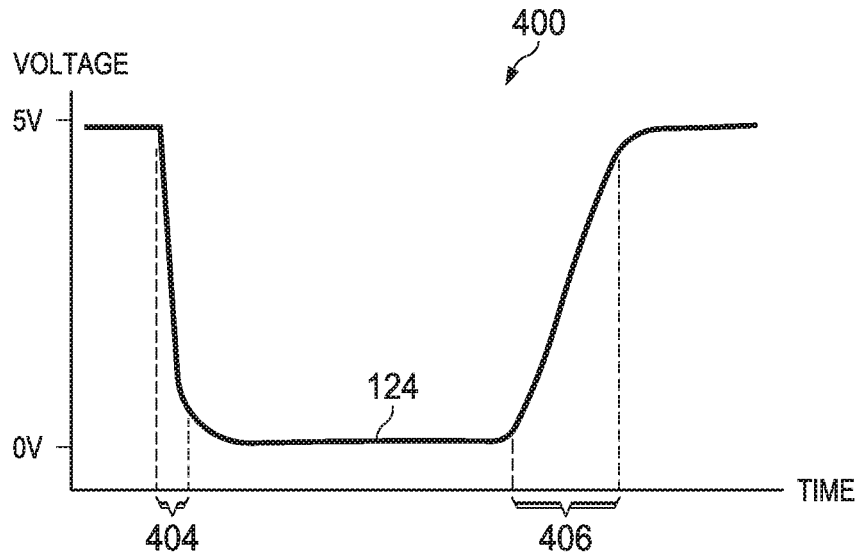
FIG. 4 shows an illustrative voltage versus time graph of an output signal of a driver amplifier in accordance with various examples.

FIG. 4 shows an illustrative voltage versus time graph 400 of output signal 124 of driver amplifier 104 in accordance with various examples. As discussed above, the output signal 124 has a faster (i.e., shorter) fall time 404 than rise time 406. Thus, the slew rate for the falling output signal 124 is higher than the slew rate for a rising output signal 124. As a falling edge in the input signal 122 is received in the driver amplifier 104, the dynamic bias circuit 112 generates an increasing magnitude bias current 250. Thus, the fall time 404 in the output signal 124 from the amplification circuit 114 decreases (i.e., slew rate increases). However, as a rising edge in the input signal 122 is received in the driver amplifier 104, the dynamic bias circuit 112 generates a decreasing magnitude bias current 250. Thus, the rise time 406 in the output signal 124 from the amplification circuit 114 increases (i.e., slew rate decreases). Therefore, the output signal 124 may comply with the SENT protocol which requires a faster fall time than rise time.

Figure 5:
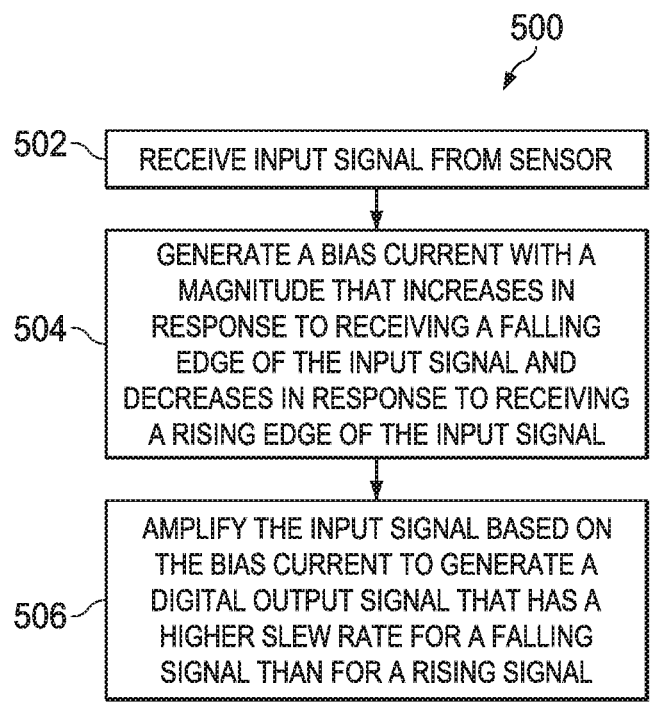
FIG. 5 shows an illustrative flow diagram of a method for generating a digital output signal in accordance with various examples.

FIG. 5 shows an illustrative flow diagram of a method 500 for generating a digital output signal in accordance with various examples. Though depicted sequentially as a matter of convenience, at least some of the actions shown can be performed in a different order and/or performed in parallel. Additionally, some embodiments may perform only some of the actions shown. In some embodiments, at least some of the operations of the method 500, as well as other operations described herein, can be performed by the driver amplifier 104 (including the dynamic bias circuit 112 and/or the amplification circuit 114) and implemented in logic and/or by a processor executing instructions stored in a non-transitory computer readable storage medium.

The method 500 begins in block 502 with receiving an input signal from a sensor. For example, an input signal, such as input signal 122, may be received from a sensor, such as sensor 102. The input signal 122 may be indicative of a physical parameter being sensed by the sensor. The input signal may be a digital differential signal (i.e., a differential pair of signals).

In block 504, the method 500 continues with generating a bias current with a magnitude that increases in response to receiving a falling edge of the input signal and decreases in response to receiving a rising edge of the input signal. For example, a dynamic bias circuit, such as dynamic bias circuit 112, may be configured with a plurality of transistors, such as transistors 202-220, and resistors, such as resistors 222-224, that cause the dynamic bias circuit to generate a bias current that increases in response to the dynamic bias circuit receiving a falling edge of the input signal and to generate a bias current that decreases in response to the dynamic bias circuit receiving a rising edge of the input signal. More particularly, the dynamic bias circuit may be configured such that the resistors limit the bias current when a rising edge of the input signal is received by the dynamic bias circuit and that boost the bias current when a falling edge of the input signal is received by the dynamic bias circuit.

The method 500 continues in block 506 with amplifying the input signal based on the bias current to generate a digital output signal that has a higher slew rate for a falling signal than for a rising signal. For example, an amplification circuit, such as amplification circuit 114, may receive both the bias current generated by the dynamic bias circuit and the input signal from the sensor. The amplification circuit may be configured with a plurality of transistors, such as transistors 302-316, a plurality of resistors, such as resistors 318-324, a plurality of capacitors, such as capacitors 326-328, and an operational amplifier, such as operation amplifier 332, that cause the amplification circuit to generate an output signal, such as output signal 124, at an increased slew rate (decrease the fall time) as a falling edge in the input signal is received by the amplification circuit and at a decreased slew rate (increase the rise time) as a rising edge in the input signal is received by the amplification circuit. This increase and decrease in slew rate may be caused by the increasing and decreasing bias current generated by the dynamic bias circuit.

The above discussion is meant to be illustrative of the principles and various embodiments of the present disclosure. Numerous variations and modifications will become apparent to those skilled in the art once the above disclosure is fully appreciated. It is intended that the following claims be interpreted to embrace all such variations and modifications.

What is claimed is:

1. An amplifier, comprising:
a dynamic bias circuit including a plurality of transistors coupled to a plurality of resistors, the dynamic bias circuit configured to generate a bias current with a magnitude that increases in response to the dynamic bias circuit receiving a falling edge of an input signal and decreases in response to the dynamic bias circuit receiving a rising edge of the input signal; and
an amplification circuit coupled to the dynamic bias circuit, the amplification circuit configured to receive the bias current and amplify the input signal based on the bias current to generate an output signal that has a higher slew rate for a falling signal than for a rising signal;
wherein the plurality of transistors includes:
a first transistor that comprises a first gate, a first source, and a first drain, the first gate connected to a first differential input of the input signal, the first drain connected to ground, and the first source connected to a first resistor;
a second transistor that comprises a second gate, a second source, and a second drain, the second gate coupled to a second differential input of the input signal, the second drain connected to ground, and the second source connected to a second resistor;
a third transistor that comprises a third gate, a third source, and a third drain, the third source connected to the first resistor; and
a fourth transistor that comprises a fourth gate, a fourth source, and a fourth drain, the fourth source connected to the second resistor and the fourth gate connected to the third gate;
wherein the plurality of transistors further includes:
a fifth transistor that comprises a fifth gate, a fifth source, and a fifth drain, the fifth gate connected to the first differential input and the fifth drain connected to ground;
a sixth transistor that comprises a sixth gate, a sixth source, and a sixth drain, the sixth gate coupled to the second differential input and the sixth drain connected to ground;
a seventh transistor that comprises a seventh gate, a seventh source, and a seventh drain, the seventh source connected to the fifth source; and
an eighth transistor that comprises an eighth gate, an eighth source, and an eighth drain, the eighth source connected to the sixth source and the eighth gate connected to the seventh gate;
wherein the first, second, fifth, and sixth transistors are p-channel metal oxide semiconductor (PMOS) transistors and the third, fourth, seventh, and eighth transistors are n-channel metal oxide semiconductor (NMOS) transistors;
wherein the plurality of transistors further includes:
a ninth transistor that comprises a ninth gate, a ninth source, and a ninth drain, the ninth drain connected to the fourth drain and the seventh drain and the ninth source connected to a power supply; and
a tenth transistor that comprises a tenth gate, a tenth source, and a tenth drain, the tenth gate connected to the ninth gate, the tenth source connected to the power supply, and the tenth drain connected to the amplification circuit.

2. The amplifier of claim 1, wherein the bias current is produced by the tenth transistor at the tenth drain.

3. The amplifier of claim 1, wherein the amplification circuit includes:
an eleventh transistor that comprises an eleventh gate, an eleventh source, and an eleventh drain, the eleventh gate connected to the first differential input and the eleventh source connected to the tenth drain; and
a twelfth transistor that comprises a twelfth gate, a twelfth source, and a twelfth drain, the twelfth gate connected to the second differential input and the twelfth source connected to the tenth drain.

4. The amplifier of claim 3, wherein the eleventh transistor and the twelfth transistor are PMOS transistors.

5. A circuit, comprising:
a plurality of resistors; and
a plurality of transistors coupled to the plurality of resistors, the plurality of transistors configured to generate a bias current with a magnitude that increases in response to a first transistor of the plurality of transistors receiving a falling edge of an input signal and decreases in response to the first transistor receiving a rising edge of the input signal;
wherein:
the plurality of transistors further includes a second transistor, a third transistor, and a fourth transistor;
the first transistor comprises a first gate, a first source, and a first drain, the first gate connected to a first differential input of the input signal, the first drain connected to ground, and the first source connected to a first resistor of the plurality of resistors;
the second transistor comprises a second gate, a second source, and a second drain, the second gate coupled to a second differential input of the input signal, the second drain connected to ground, and the second source connected to a second resistor of the plurality of resistors;
the third transistor that comprises a third gate, a third source, and a third drain, the third source connected to the first resistor; and
the fourth transistor that comprises a fourth gate, a fourth source, and a fourth drain, the fourth source connected to the second resistor and the fourth gate connected to the third gate;
wherein the plurality of transistors further includes:
a fifth transistor that comprises a fifth gate, a fifth source, and a fifth drain, the fifth gate connected to the first differential input and the fifth drain connected to ground;
a sixth transistor that comprises a sixth gate, a sixth source, and a sixth drain, the sixth gate coupled to the second differential input and the sixth drain connected to ground;
a seventh transistor that comprises a seventh gate, a seventh source, and a seventh drain, the seventh source connected to the fifth source; and
an eighth transistor that comprises an eighth gate, an eighth source, and an eighth drain, the eighth source connected to the sixth source and the eighth gate connected to the seventh gate;
wherein the plurality of transistors further includes:
a ninth transistor that comprises a ninth gate, a ninth source, and a ninth drain, the ninth drain connected to the fourth drain and the seventh drain and the ninth source connected to a power supply; and
a tenth transistor that comprises a tenth gate, a tenth source, and a tenth drain, the tenth gate connected to the ninth gate, the tenth source connected to the power supply, and the tenth drain connected to an eleventh transistor and a twelfth transistor of an amplification circuit.

6. The circuit of claim 5, wherein the bias current is produced by the tenth transistor at the tenth drain.

7. The circuit of claim 5, wherein the first, second, fifth, sixth, ninth, and tenth transistors are p-channel metal oxide semiconductor (PMOS) transistors and the third, fourth, seventh, and eighth transistors are n-channel metal oxide semiconductor (NMOS) transistors.

8. A method for generating a digital output signal, comprising:
receiving, by a dynamic bias circuit, an input signal from a sensor;
generating, by the dynamic bias circuit, a bias current with a magnitude that increases in response to the dynamic bias circuit receiving a falling edge of the input signal and decreases in response to the dynamic bias circuit receiving a rising edge of the input signal; and
amplifying, by an amplification circuit, the input signal based on the bias current to generate the digital output signal that has a higher slew rate for a falling signal than for a rising signal;
wherein the dynamic bias circuit includes:
a first transistor that comprises a first gate, a first source, and a first drain, the first gate connected to a first differential input of the input signal, the first drain connected to ground, and the first source connected to a first resistor;
a second transistor that comprises a second gate, a second source, and a second drain, the second gate coupled to a second differential input of the input signal, the second drain connected to ground, and the second source connected to a second resistor;
a third transistor that comprises a third gate, a third source, and a third drain, the third source connected to the first resistor;
a fourth transistor that comprises a fourth gate, a fourth source, and a fourth drain, the fourth source connected to the second resistor and the fourth gate connected to the third gate;
a fifth transistor that comprises a fifth gate, a fifth source, and a fifth drain, the fifth gate connected to the first differential input and the fifth drain connected to ground;
a sixth transistor that comprises a sixth gate, a sixth source, and a sixth drain, the sixth gate coupled to the second differential input and the sixth drain connected to ground;
a seventh transistor that comprises a seventh gate, a seventh source, and a seventh drain, the seventh source connected to the fifth source;
an eighth transistor that comprises an eighth gate, an eighth source, and an eighth drain, the eighth source connected to the sixth source and the eighth gate connected to the seventh gate;
a ninth transistor that comprises a ninth gate, a ninth source, and a ninth drain, the ninth drain connected to the fourth drain and the seventh drain and the ninth source connected to a power supply; and
a tenth transistor that comprises a tenth gate, a tenth source, and a tenth drain, the tenth gate connected to the ninth gate, the tenth source connected to the power supply, and the tenth drain connected to an eleventh transistor and a twelfth transistor of the amplification circuit.

9. The method of claim 8, wherein the bias current is produced by the tenth transistor at the tenth drain.

* * * * *